United States Patent
Che et al.

(10) Patent No.: US 12,362,247 B2
(45) Date of Patent: Jul. 15, 2025

(54) SEMICONDUCTOR DEVICES WITH FLEXIBLE SPACER INCLUDING A SUPPORT STRUCTURE AND METHODS OF MAKING THE SAME

(71) Applicant: Micron Technology, Inc., Boise, ID (US)

(72) Inventors: Faxing Che, Singapore (SG); Wei Yu, Singapore (SG); Yeow Chon Ong, Singapore (SG); Shin Yueh Yang, Taichung (TW); Hong Wan Ng, Singapore (SG)

(73) Assignee: Micron Technology, Inc., Boise, ID (US)

( * ) Notice: Subject to any disclaimer, the term of this patent is extended or adjusted under 35 U.S.C. 154(b) by 407 days.

(21) Appl. No.: 17/883,153

(22) Filed: Aug. 8, 2022

(65) Prior Publication Data
US 2024/0047285 A1    Feb. 8, 2024

(51) Int. Cl.
*H01L 23/14* (2006.01)
*H01L 21/52* (2006.01)

(52) U.S. Cl.
CPC .............. *H01L 23/14* (2013.01); *H01L 21/52* (2013.01)

(58) Field of Classification Search
CPC .................................. H01L 23/14; H01L 21/52
USPC .......................................................... 257/666
See application file for complete search history.

(56) References Cited

U.S. PATENT DOCUMENTS

| | | | |
|---|---|---|---|
| 2016/0247767 A1* | 8/2016 | Kim | H01L 23/3128 |
| 2020/0203315 A1* | 6/2020 | Shih | H01L 24/17 |

* cited by examiner

*Primary Examiner* — Quoc D Hoang
(74) *Attorney, Agent, or Firm* — Dorsey & Whitney LLP

(57) ABSTRACT

A semiconductor device assembly includes a semiconductor die, a substrate, and a spacer directly coupled to the substrate. The spacer includes a flexible main body and a support structure embedded in the flexible main body, wherein the support structure has a higher stiffness than the flexible main body. The spacer carries the semiconductor die. The flexible main body of the spacer mitigates the effects of thermomechanical stress, for example caused by a mismatch between the coefficient of thermal expansion of the semiconductor die and the substrate. The embedded support structure provides strength needed to support the semiconductor die during assembly.

17 Claims, 10 Drawing Sheets

SEMICONDUCTOR DEVICES WITH FLEXIBLE SPACER INCLUDING A SUPPORT STRUCTURE AND METHODS OF MAKING THE SAME

TECHNICAL FIELD

The present technology generally relates to semiconductor devices, and more particularly relates to semiconductor devices having a flexible spacer mounted on a substrate.

BACKGROUND

Packaged semiconductor dies, including memory chips, microprocessor chips, and imager chips, typically include a semiconductor die mounted on a substrate and encased in a protective covering. The semiconductor die can include functional features, such as memory cells, processor circuits, and imager devices, as well as bond pads electrically connected to the functional features. The bond pads can be electrically connected to terminals outside the protective covering to allow the semiconductor die to be connected to higher level circuitry.

BRIEF DESCRIPTION OF THE DRAWINGS

Many aspects of the present technology can be better understood with reference to the following drawings. The components in the drawings are not necessarily to scale. Instead, emphasis is placed on illustrating clearly the principles of the present technology.

DETAILED DESCRIPTION

Figure 1A:
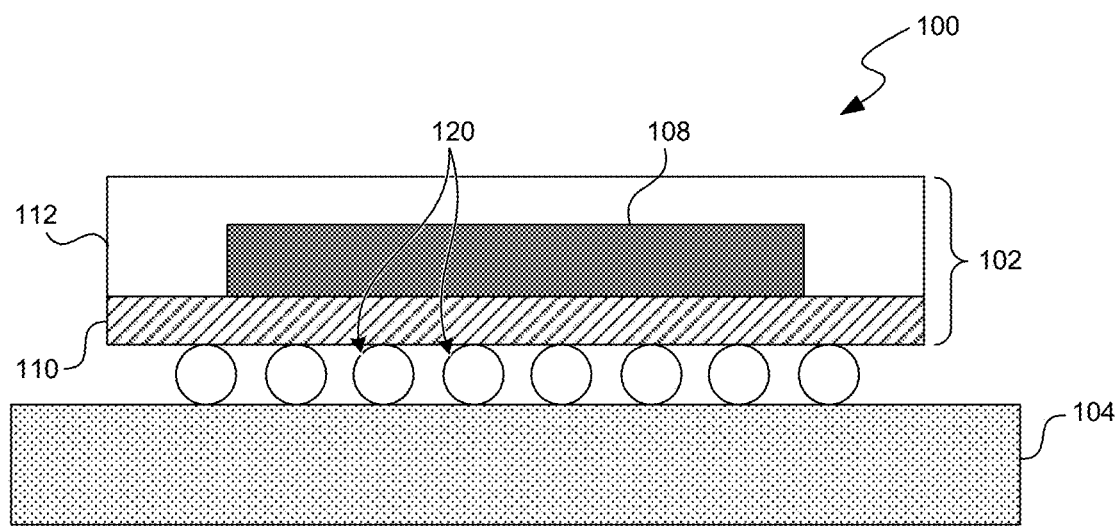
FIG. 1A is a side cross-sectional view of a semiconductor device assembly.

Specific details of several embodiments of semiconductor devices, and associated systems and methods, are described below. A person skilled in the relevant art will recognize that suitable stages of the methods described herein can be performed at the wafer level or at the die level. Therefore, depending upon the context in which it is used, the term "substrate" can refer to a wafer-level substrate or to a singulated, die-level substrate. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, plating, electroless plating, spin coating, and/or other suitable techniques. Similarly, materials can be removed, for example, using plasma etching, wet etching, chemical-mechanical planarization, or other suitable techniques.

In some semiconductor assemblies, a packaged semiconductor die can be electrically coupled to a printed circuit board (PCB) via solder bumps arranged in a ball grid array (BGA). However, cyclic heating and/or cooling of the semiconductor package can induce significant thermomechanical stress between the semiconductor package and the PCB due to a mismatch in the coefficients of thermal expansion (CTE) of these components. Often, the stress can induce cracking of the semiconductor package at the solder joints. In addition, a mismatch between the CTE of the substrate and the CTE of the semiconductor die mounted on the substrate can introduce stress that causes conductive traces in the substrate to crack. Both of these stresses can render the semiconductor package inoperable.

The solder joint interface between the package substrate and the PCB is often a weak point of a semiconductor package when subjected to temperature cycling on board level (TCOB). At the same time, a CTE mismatch between the relatively low CTE of the semiconductor die and the higher CTE of the substrate also results in stress on the conductive traces of the substrate, causing the conductive traces to break or crack. These issues are especially problematic when a relatively thick die or stack of semiconductor dies is directly mounted onto a thin substrate. In addition, stresses caused by CTE mismatch can be introduced during the assembly process, by thermal cycling or thermal shock during component/board level reliability testing, or by temperature or power cycling during end-customer usage.

Introduced are techniques for implementing a flexible spacer positioned between the semiconductor die and the package substrate that reduces both board level solder joint deformation and stress on the conductive traces of the substrate caused by CTE mismatches. The flexible spacer comprises a flexible main body that reduces cracking and fracturing by compressing, stretching, or bending in response to thermomechanical stress, thus reducing the stress applied to the solder joints or conductive traces. In addition, the flexible spacer lifts the semiconductor die from the substrate, thus removing the CTE mismatch at the interface between the die and the substrate. The flexible spacer can have a CTE with a value in between that of the semiconductor die and the substrate on either side to further reduce the stress caused by CTE mismatches. The flexible spacer thus improves the reliability and robustness of semiconductor devices, particularly in applications involving temperature or power cycling or other harsh field usage conditions, such as automotive applications.

But although flexibility can reduce the effects of thermomechanical stress, such flexibility may affect the ability of the flexible spacer to sufficiently support the semiconductor die during assembly processes, such as during die attach or wire bonding processes. To provide additional support, the flexible spacer can further include a support structure with a high stiffness embedded in the flexible main body. Thus, the flexible spacer is a hybrid structure that provides both flexibility for reducing thermomechanical stress and structural support for the assembly process. The stiffnesses of the flexible main body and the embedded support structures can be selected to provide the desired balance between flexibility and support for a particular use case. In addition, the size, number, and location(s) of the embedded support structures can also be varied when designing a flexible spacer.

Numerous specific details are disclosed herein to provide a thorough and enabling description of embodiments of the present technology. A person skilled in the art, however, will understand that the technology may have additional embodiments and that the technology may be practiced without several of the details of the embodiments described below with reference to the Figures. For example, some details of semiconductor devices and/or packages well known in the art have been omitted so as not to obscure the present technology. In general, it should be understood that various other devices and systems in addition to those specific embodiments disclosed herein may be within the scope of the present technology.

As used herein, the terms "vertical," "lateral," "upper," "lower," "above," and "below" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

FIG. 1A is a side cross-sectional view of a semiconductor device assembly 100 ("assembly 100"). The assembly 100 includes a semiconductor package 102 coupled to a PCB 104 via an array of connectors 120 (e.g., a solder BGA). The semiconductor package 102 includes a semiconductor die 108 mounted on a package substrate 110 and encapsulated by a mold material 112.

Figure 1B:
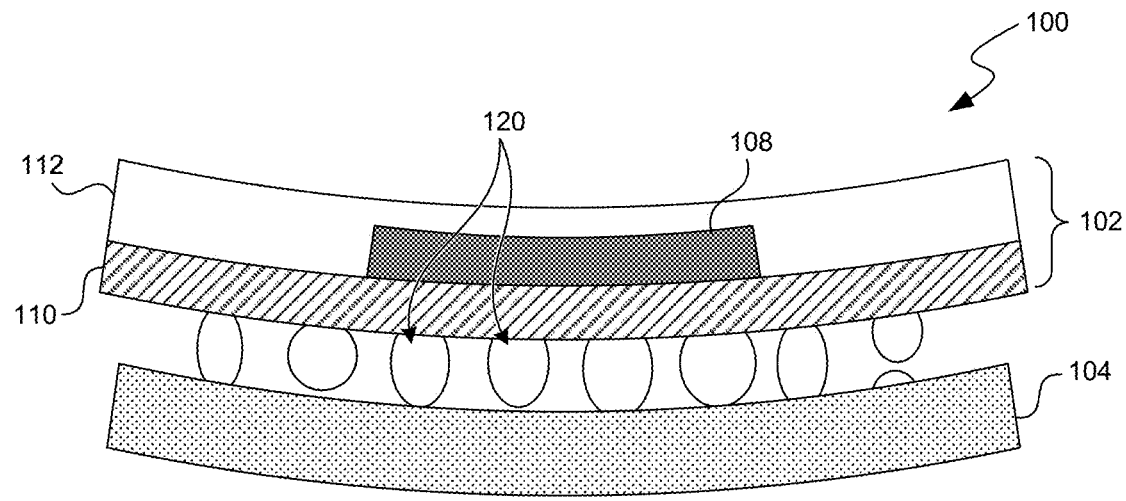
FIG. 1B is a side cross-sectional view of the assembly of FIG. 1A when subjected to thermomechanical stress.

FIG. 1B is a side cross-sectional view of the assembly 100 when subjected to thermomechanical stress, e.g., during manufacturing and/or usage. Thermomechanical stresses may be induced, for example, by the assembly process, by thermal cycling and/or thermal shock during component/board level reliability testing, and/or by temperature and/or power cycling during end-customer usage. In some embodiments, the semiconductor package 102 or a component thereof (e.g., the package substrate 110) has a coefficient of thermal expansion (CTE) that is different than the CTE of the PCB 104, and the CTE mismatch between these components can cause them to deform (e.g., warp, bend) relative to one another during cooling and/or heating of the assembly 100. For example, as shown in FIG. 1B, the semiconductor package 102 and PCB 104 can have a warped, non-planar shape after heating and/or cooling. The relative deformation of the semiconductor package 102 and the PCB 104 can result in thermomechanical loading of the connectors 120 that leads to fatigue and/or creep failures. For example, as shown in FIG. 1B, cracks can form and propagate within the connectors 120. Cracks can also form and propagate at the interface between the connectors 120 and the semiconductor package 102 or the PCB 104. Once the crack length reaches a critical value, the electrical coupling between the package 102 and the PCB 104 can be disrupted, rendering the assembly 100 fully or partially inoperable. This process can be accelerated under conditions where the assembly 100 is subject to cyclic loading and/or extreme temperature fluctuations (e.g., in automotive applications).

Figure 2:
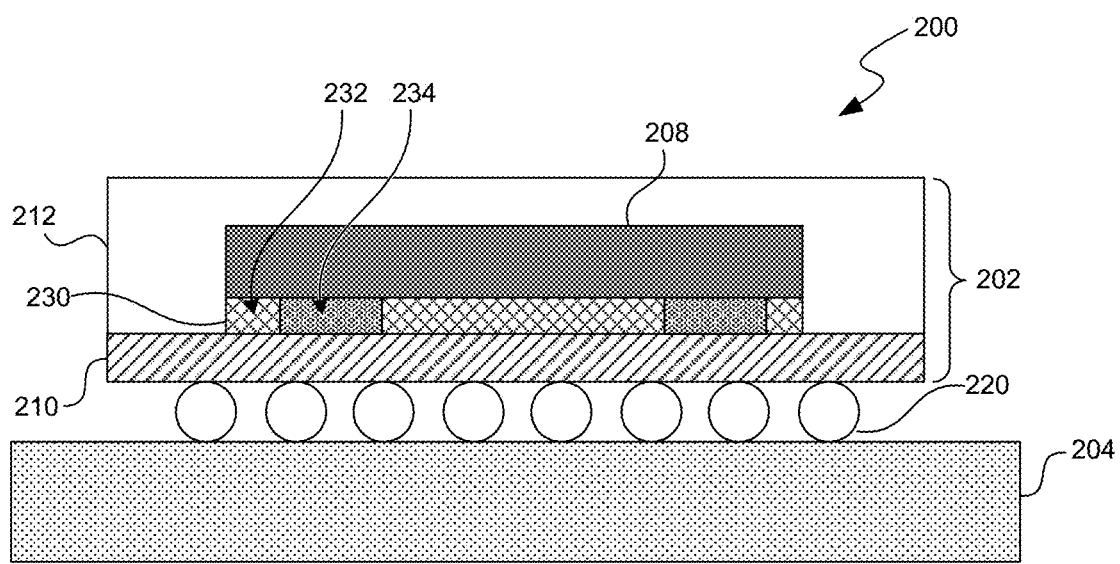
FIG. 2 is a side cross-sectional view of a semiconductor device assembly including a flexible spacer, in accordance with embodiments of the present technology.

FIG. 2 is a side cross-sectional view of a semiconductor device assembly including a flexible spacer in accordance with embodiments of the present technology. The semiconductor device assembly 200 is similar to the semiconductor device assembly 100 of FIGS. 1A and 1B, except for the inclusion of a spacer 230. The semiconductor device assembly 200 includes a semiconductor package 202 coupled to a PCB 204 by solder joints 220. The semiconductor package 202 includes a substrate 210 (e.g., a silicon substrate, a gallium arsenide substrate, an organic laminate substrate, etc.). The spacer 230 is coupled directly to the substrate, and a semiconductor die 208 is positioned on the spacer 230. The semiconductor package is encapsulated by an encapsulant 212.

The semiconductor package 202 can include various types of semiconductor components and/or functional features, such as memory circuits (e.g., dynamic random-access memory (DRAM), static random-access memory (SRAM), flash memory, or other type of memory circuits), controller circuits (e.g., DRAM controller circuits), logic circuits, processing circuits, circuit elements (e.g., wires, traces, interconnects, transistors, etc.), imaging components, and/or other semiconductor features.

In some embodiments, the package substrate 210 includes a redistribution layer, an interposer, a printed circuit board, a dielectric spacer, another semiconductor die (e.g., a logic die), or another suitable substrate. In some embodiments, the package substrate 210 includes semiconductor components (e.g., doped silicon wafers or gallium arsenide wafers), nonconductive components (e.g., various ceramic substrates, such as aluminum oxide ($Al_2O_3$), etc.), aluminum nitride, and/or conductive portions (e.g., interconnecting circuitry, through-silicon vias (TSVs), etc.).

Although the illustrated embodiment shows a single semiconductor die 208, in other embodiments the semiconductor package 202 can include multiple semiconductor dies (e.g., two, four, five, six, seven, eight nine, ten, or more dies) arranged in a die stack. For example, a stack of semiconductor dies 208 can be mounted on a single spacer 230. In addition, although FIG. 2 depicts a single spacer 230 and a single semiconductor die 208 on top of the spacer 230, embodiments of the semiconductor device assembly 200 can include multiple spacers 230, each with one or more semiconductor dies 208 on the spacers 230.

Instead of being directly mounted on the substrate 210, the semiconductor die 208 is lifted by the spacer 230, mitigating the effects of a CTE mismatch between the semiconductor die 208 and the substrate 210. The semiconductor die 208 or the substrate 210 can deform in response to thermomechanical stress. The flexible main body 232 is configured to provide a buffer that absorbs the stress caused by these deformations, thus reducing the stress that propagates through the semiconductor device assembly 200 and mitigating damage to the other components.

The spacer 230 comprises a flexible main body 232 and a support structure 234 embedded in the flexible main body 232. The flexible main body 232 has a stiffness lower than that of the support structure 234. The stiffness of the flexible main body 232 and the support structure 234 can be expressed using Young's modulus or other known parameters in the art. In some embodiments, the flexible main body 232 has a Young's modulus between approximately 5 GPa to 30 GPa and the support structure 234 has a Young's modulus between approximately 50 GPa to 300 GPa. The Young's modulus can be measured by any of a number of existing methods. For example, the stress and strain of the material can be measured as load is applied, and the ratio of stress to strain is determined as the Young's modulus.

The flexible main body 232 is configured to prevent cracking in the conductive traces (e.g., copper traces) of the substrate 210 by providing a flexible buffer layer between the semiconductor die 208 and the substrate 210. The flexibility of the flexible main body 232 also deforms in response to thermomechanical stress, which effectively enables the flexible main body to absorb stresses that would otherwise affect other portions of the semiconductor device assembly 200, such as the solder joints 220. In some embodiments, the flexible main body comprises a polymer such as an epoxy molding compound. For instance, the flexible main body 232 can be the same material used as the encapsulant 212, or it can be a different compound. In some embodiments, the flexible main body has a CTE with a value in between the CTE of the semiconductor die and the CTE of the substrate 210. For example, the flexible main body can have a CTE greater than the CTE of the semiconductor die 208 and less than the CTE of the substrate 210.

The support structure 234 has a higher stiffness (e.g., Young's modulus) than the flexible main body 232 and is configured to increase the overall stiffness of the spacer 230, which is beneficial during assembly processes, such as wire-bonding. In contrast, a spacer 230 which does not include a support structure 234 provides less structural stability to withstand assembly. Note that in addition to wire-bonding, other methods known in the art of providing electrical connections can be used in conjunction with the spacer 230.

The support structure 234 can be comprised of metal, silicon, or ceramic material and be any suitable shape. For example, the support structure can be rectangular, elliptical, etc., as viewed from above (e.g., plan view.) Although two support structures 234 are shown in FIG. 2, the spacer 230 can be configured with any suitable number of support structures 234 as needed to support different sizes or numbers of semiconductor dies. For example, a larger semiconductor die 108 may need a larger number of support structures 234 embedded in the spacer 230. The support structure 234 shown in FIG. 2 has approximately the same height as the flexible main body 232. In some embodiments, the support structure 234 has a smaller height than the flexible main body 232. A support structure 234 with a smaller height can enable more flexibility of the spacer 230 but may also decrease the overall stiffness compared to a taller support structure 234. For example, the height of the flexible main body 232 can be between approximately 50 μm and 150 μm, and the height of the support structure 234 can be between approximately 50 μm and 150 μm. In some embodiments, the height of the support structure 234 is approximately 20 μm less than the height of the flexible main body 232 Beside the height, shape, and number of support structures 234, the plan dimensions and arrangement of support structures 234 can also be configured as needed. For example, the support structures 234 of FIG. 2 can be spaced more narrowly for a smaller semiconductor die 208.

In some embodiments, implementing the spacer 230 in the semiconductor device assembly 200 can improve solder joint reliability (SJR) of the solder joint 220 by at least 1.5 times, 2 times, or 2.5 times compared to a similar semiconductor device assembly without the spacer 230. In some embodiments, implementing the spacer 230 can reduce the stress on the conductive traces of the substrate 210 by at least 15%, 20%, or 25% compared to a similar semiconductor device assembly without the spacer 230.

The dimensions of the spacer 230 can be configured relative to the dimensions of the semiconductor die 208. For example, the width of the spacer 230 is shown in FIG. 2 to have approximately the same width as the semiconductor die 208. In some embodiments, the dimensions of the spacer 230, e.g., length, width, or area, are smaller than the semiconductor die. Having a smaller spacer 230 than the semiconductor die 208 can provide more space for wire-bonds, other connections, or other components on the substrate 210.

Figure 3A:
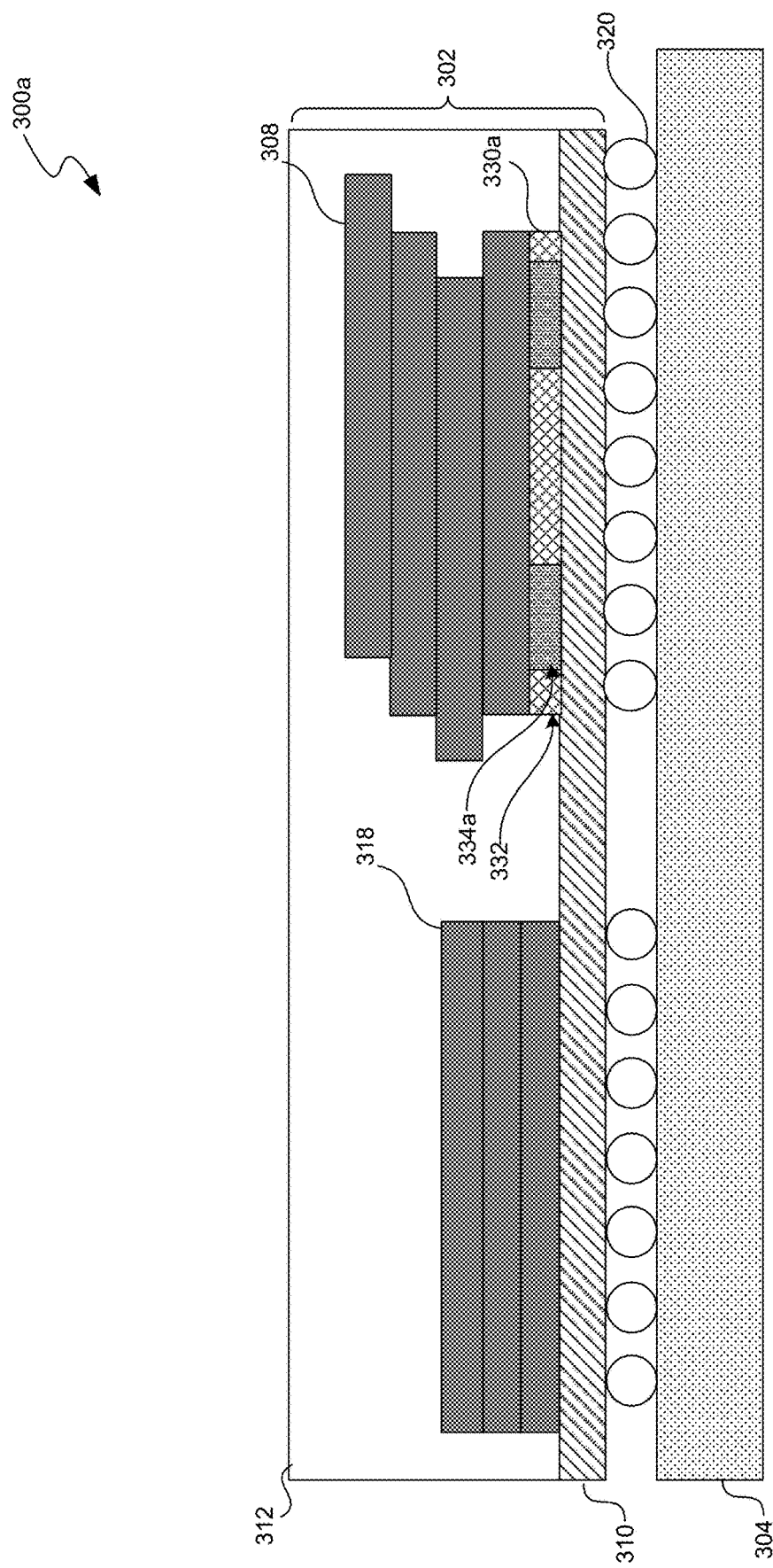
FIG. 3A is a side cross-sectional view of a semiconductor device assembly including a flexible spacer and a semiconductor die stack, in accordance with embodiments of the present technology.

FIG. 3A is a side cross-sectional view of a semiconductor device assembly including a flexible spacer and a semiconductor die stack, in accordance with embodiments of the present technology. The semiconductor device assembly 300a is similar to the semiconductor device assembly 200 of FIG. 2 but includes multiple semiconductor die stacks 308 and 318, where the semiconductor die stack 308 is carried by a spacer 330a. The spacer 330a is similar to the spacer 230 of FIG. 2, comprising a flexible main body 332 and one or more support structures 334a. Similar to the spacer 230 of FIG. 2, the spacer 330a is coupled directly to the substrate 310. The semiconductor device assembly 300a includes a semiconductor package 302 coupled to a PCB 304 by solder joints 320. The semiconductor package 302 is encapsulated by an encapsulant 312.

As discussed previously with reference to FIG. 2, the spacer 330a can be configured with different sizes or shapes of support structures 334a. For instance, different devices will have different sizes, weights, or package reliability requirements, which can require different arrangements of the support structures 334a. Example arrangements of the support structures are shown in FIGS. 3B and 3C.

In some embodiments, the semiconductor die stacks 308 and 318 are stacks of memory dies. For example, the die stack 308 can comprise NAND memory, and the die stack 318 can comprise dynamic random-access memory (DRAM). However, the die stacks 308 and 318 are not limited to memory dies. Furthermore, the spacer 330a can carry various types of semiconductor dies. The die stacks 308 and 318 include interconnect components not shown, such as bumps, spacers, TSVs, or wire bonds. In some embodiments, flexible spacer 330a can also separate individual dies of the die stacks 308 and 318, rather than only separating the substrate 310 from a bottom die of the die stack.

Figure 3B:
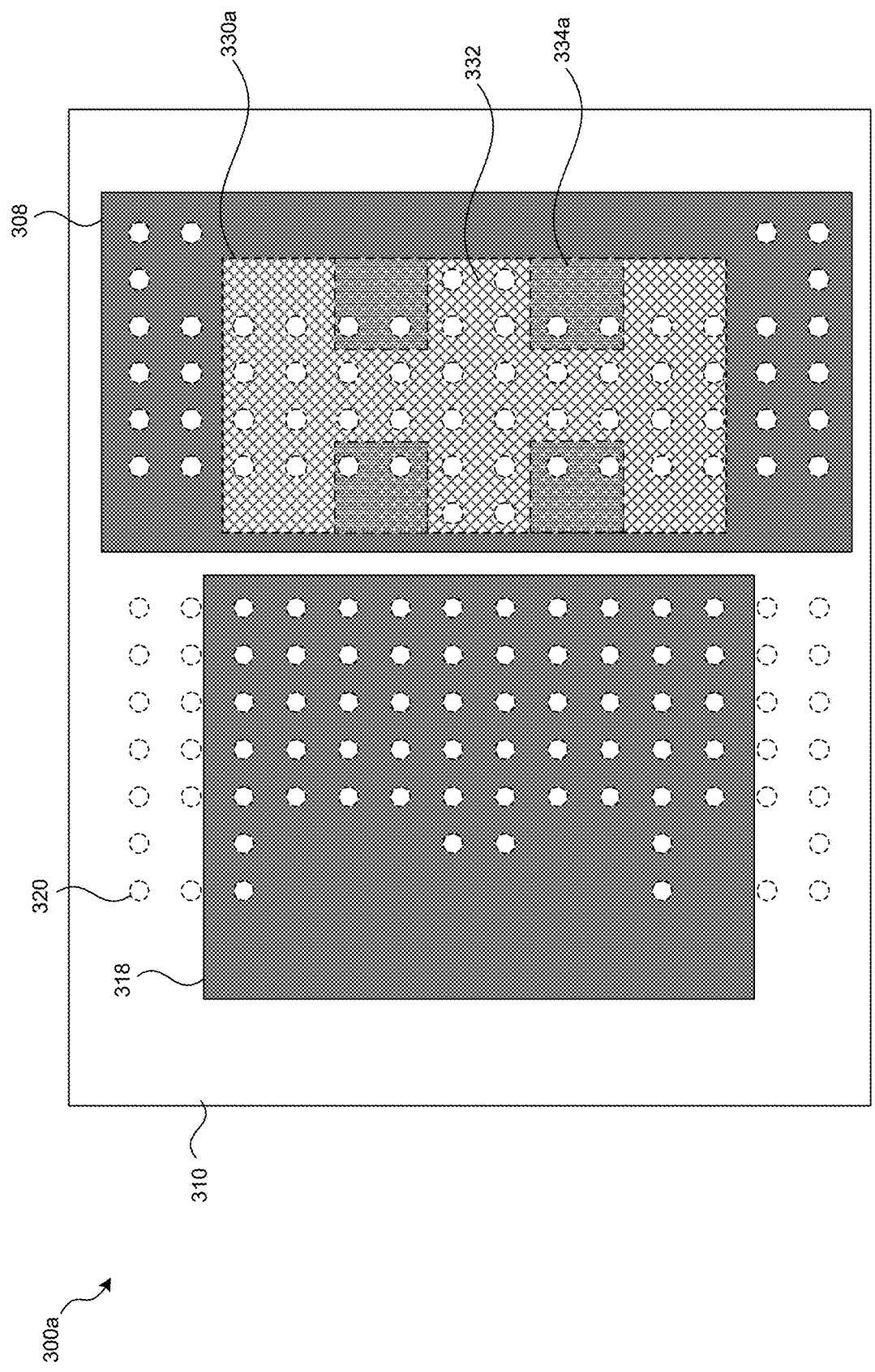
FIG. 3B is a top-down view of the semiconductor device assembly shown in FIG. 3A.

FIG. 3B is a top-down view of the semiconductor device assembly 300a shown in FIG. 3A. The semiconductor device assembly 300a includes an array of solder joints 320 below the substrate 310. The semiconductor die stack 318 is mounted directly on the substrate 310, e.g., by die attach film or flip-chip bonding. The semiconductor die stack 308 is carried by the spacer 330a, and the spacer 330a is mounted on the substrate 310. The spacer 330a includes four support structures 334a embedded in a flexible main body 332. As shown, the support structures 334a are approximately square shaped. Not shown is the PCB 304 that is coupled to the solder joints 320.

Figure 3C:
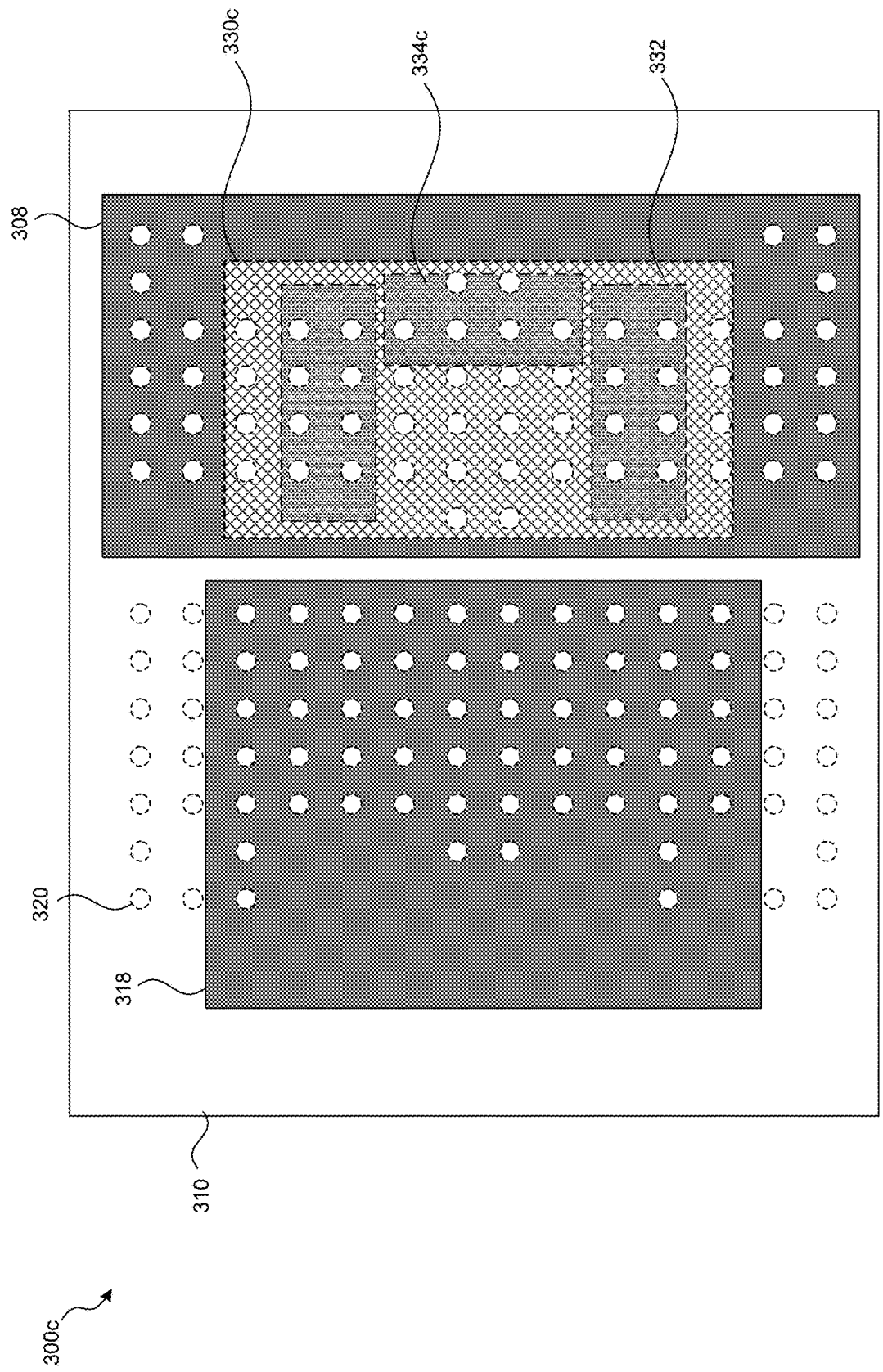
FIG. 3C is a top-down view of another semiconductor device assembly, in accordance with embodiments of the present technology.

FIG. 3C is a top-down view of another semiconductor device assembly 300c with a spacer 330c, in accordance with embodiments of the present technology. Like the semiconductor device assembly 300a, the semiconductor device assembly 300c includes an array of solder joints 320 below the substrate 310. The semiconductor die stack 318 is mounted directly on the substrate 310, e.g., by die attach film or flip-chip bonding. The semiconductor die stack 308 is carried by a spacer 330c, and the spacer 330c is mounted on the substrate 310. The spacer 330c includes three support structures 334c embedded in a flexible main body 332. As shown, the support structures 334c are approximately rectangular, where adjacent sides have unequal length. The rectangular support structures 334c are arranged in a U-shape configuration.

Figure 4A:
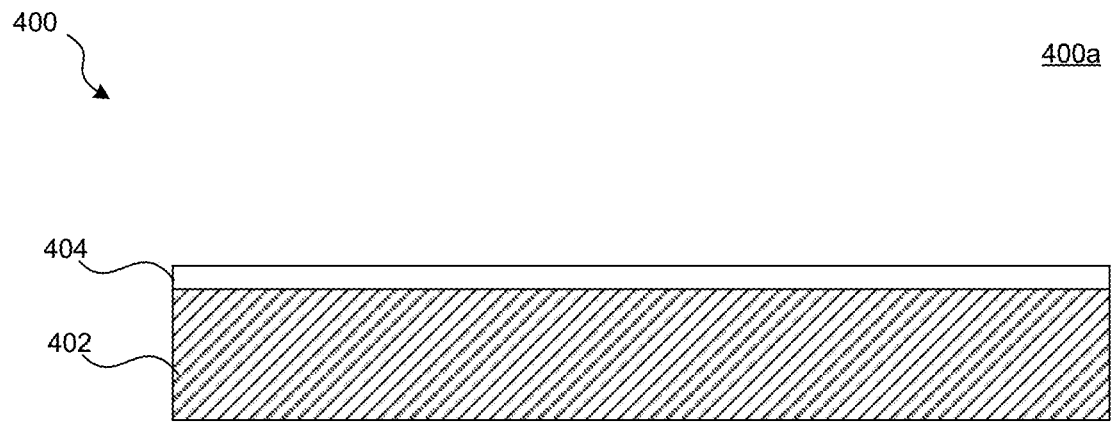
FIGS. 4A-F illustrate a semiconductor device assembly at various stages of a fabrication process, in accordance with embodiments of the present technology.

FIGS. 4A-F illustrate a semiconductor device assembly 400 at various stages 400a-f of a fabrication process, in accordance with embodiments of the present technology. FIG. 4A is a cross-sectional view of the semiconductor device assembly 400 at a first stage 400a including a thermal release tape 404 applied to a carrier 402. The carrier 402 has a flat and smooth surface, e.g., glass or other carrier substrate. The carrier 402 can be a round or rectangular panel.

Figure 4B:
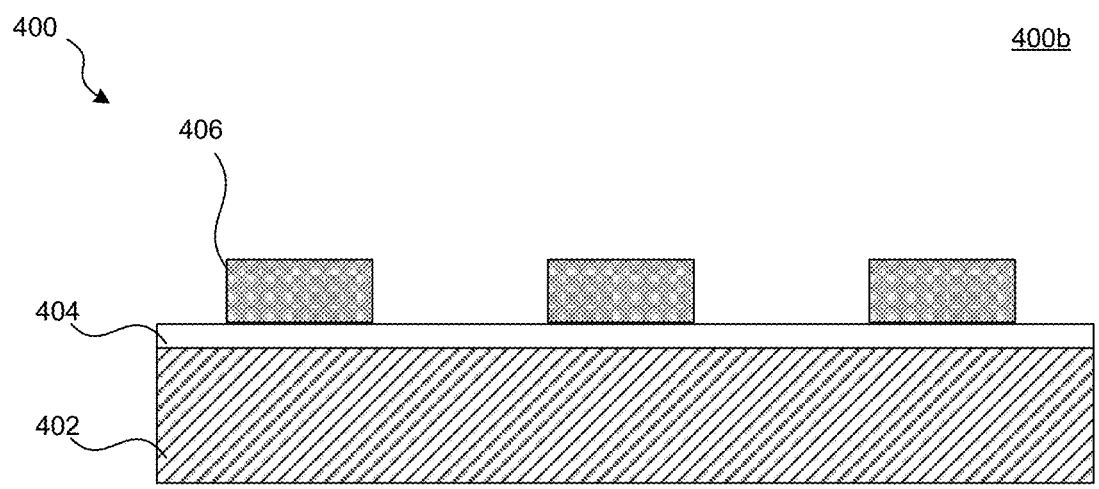

FIG. 4B is a cross-sectional view of the semiconductor device assembly 400 including plurality of support structures 406 attached to the thermal release tape 404. The support structures 406 are similar to the support structures 234, 334a and 334c of FIGS. 2 and 3A-C. The support structures 406 can be configured to provide sufficient stiffness to withstand assembly processes for a semiconductor die mounted above the support structures 406. The support structures 406 can comprise silicon, ceramic, or a metal.

Figure 4C:
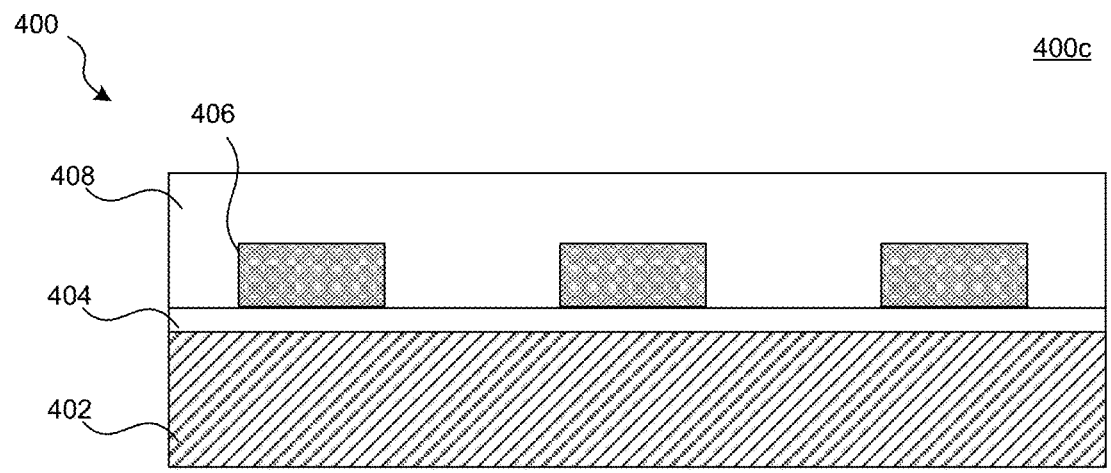

FIG. 4C is a cross-sectional view of the semiconductor device assembly 400 with an encapsulant 408 that encapsulates the support structures 406. The encapsulant 408 can be compression molded, for example using epoxy molding compound. The encapsulant 408 can be the same material as the flexible main body 232 and 332 of FIGS. 2 and 3A-C. In some embodiments, the encapsulant 408 comprises the same material as the encapsulant 212 or 312 of FIGS. 2 and 3A-C. In some embodiments, the encapsulant 408 is comprised of different materials than the encapsulant 212 or 312. In some embodiments, a post-mold curing step is performed.

Figure 4D:
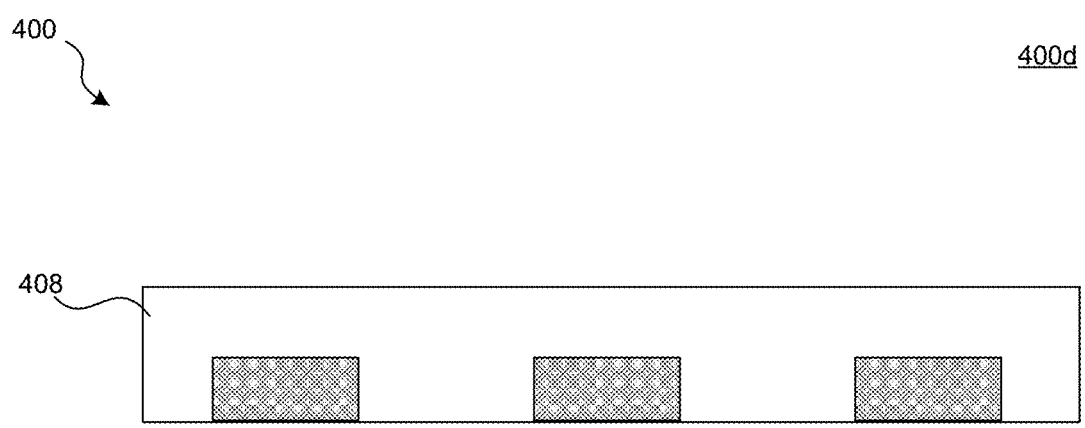

FIG. 4D is a cross-sectional view of the semiconductor device assembly 400 after releasing the thermal release tape 404 and the carrier 402, e.g., by applying heat. In some embodiments, back grinding can be performed after releasing the carrier 402 from the semiconductor device assembly 400. At this stage 400d, the support structures 406 can be exposed from the encapsulant 408. After release, semiconductor device assembly 400 is cleaned.

Figure 4E:
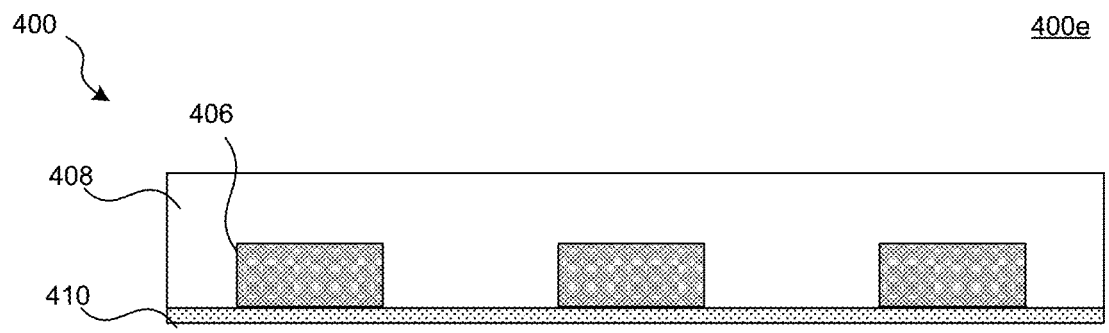

FIG. 4E is a cross-sectional view of the semiconductor device assembly 400 at a stage 400e with a die attach film 410 laminated on its back surface. The die attach film can be applied using techniques known in the art for laminating components used to produce semiconductor devices or packaging.

Figure 4F:
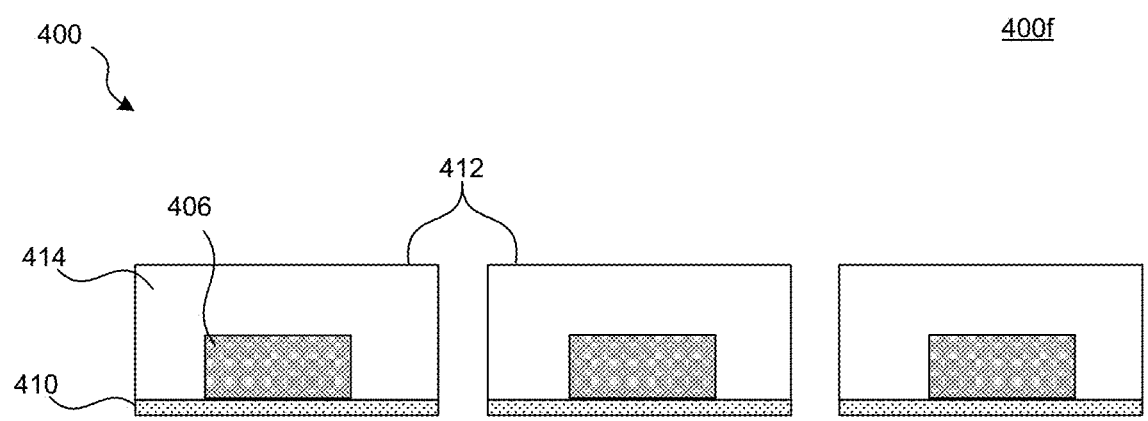

FIG. 4F is a cross-sectional view of a plurality of spacers 412 with segments of the die attach film 410, formed by singulating the semiconductor device assembly 400 of FIG. 4E. The spacers 412 are similar to the spacers 230, 330a, and 330c of FIGS. 2 and 3A-C. After singulation, each of the spacers 412 comprise at least one support structure 406 embedded in a flexible main body 414. The flexible main body 414 is formed from the encapsulant 408 applied in FIG. 4C. The position of the support structures 406 within the spacer can be configured relative to the spacer, as shown in FIGS. 3B and 3C, by where the support structures are initially positioned, as shown in at stage 400b of FIG. 4B, and by how the semiconductor device is singulated at stage 400f.

The dimensions of the spacer 412 can be configured based on the requirements of semiconductor device carried by the spacer 412 (e.g., semiconductor die 208 of FIG. 2 and semiconductor die stack 308 of FIGS. 3A-C.) The height (e.g., thickness) of the spacer 412 can be configured by adjusting the amount of molding compound at stage 400c and further reduced by grinding. In addition, the relative height of the support structure 406 compared to the flexible main body 414 can be configured. For example, the support structure 406 can have a height less than the height of the flexible main body 414, as shown in FIG. 4F. In some embodiments, the support structure 406 has the same height as the flexible main body 414, such that the support structure 406 is exposed. Following singulation, the spacer 412 can then be attached directly to a substrate by the segment of die attach film 410.

Figure 5:
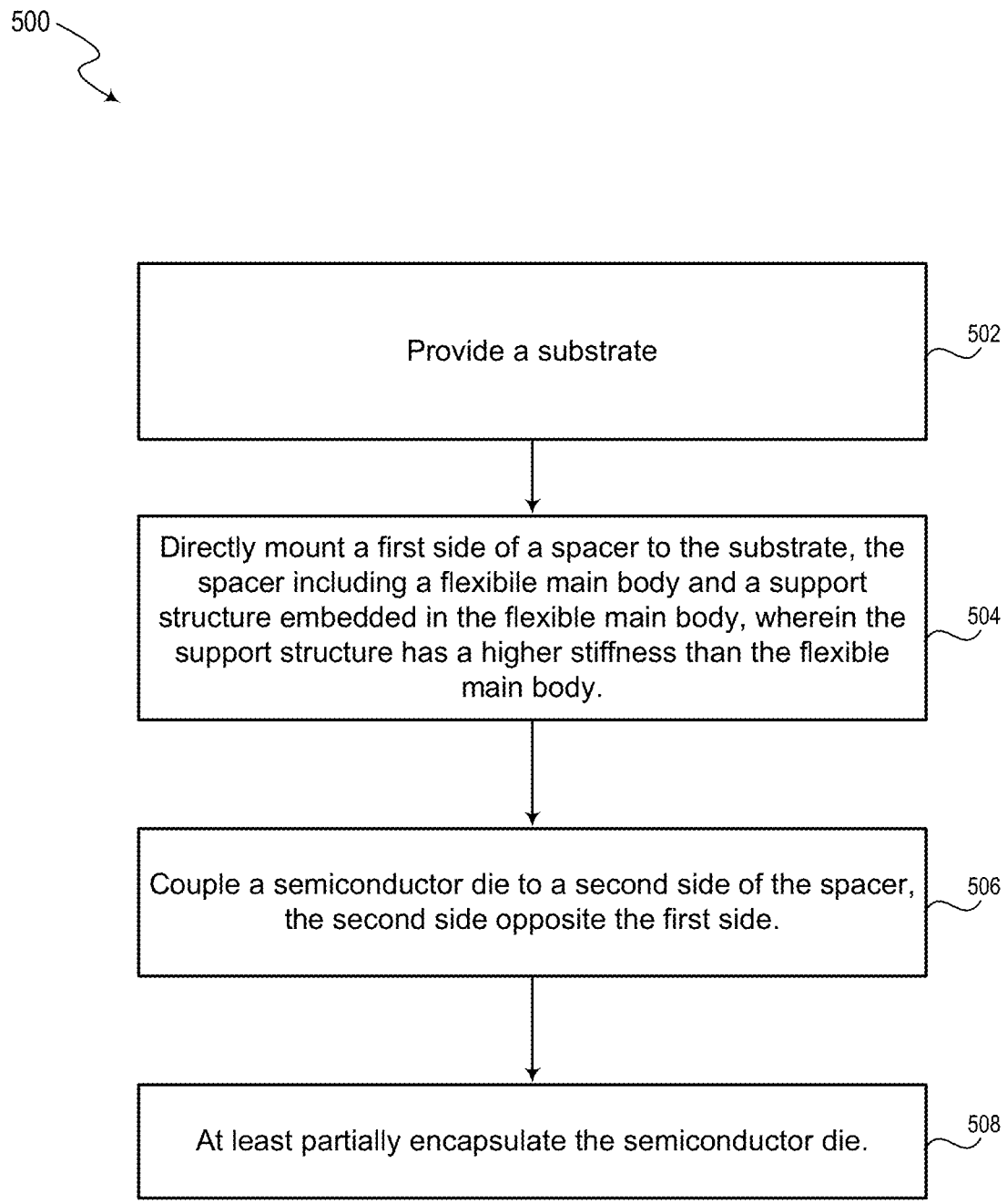
FIG. 5 is a flowchart illustrating a method of producing a semiconductor device assembly, in accordance with embodiments of the present technology.

FIG. 5 is a flowchart illustrating a method 500 of producing a semiconductor device assembly, in accordance with embodiments of the present technology. At 502, a substrate is provided. For instance, the substrate can be similar to the substrate 210 and 310 of FIGS. 2 and 3A-C. At 504, a first side of a spacer (e.g., spacer 230, 330a, 330c, or 412 of FIGS. 2-4F) is directly mounted to the substrate, where the spacer includes a flexible main body and a support structure embedded in the flexible main body. The support structure has a higher stiffness than the flexible main body.

In some embodiments, the support structure of the spacer has a first coefficient of thermal expansion (CTE), and wherein the first CTE is greater than or equal to a second CTE of the semiconductor die and less than or equal to a third CTE of the substrate. In some embodiments, the support structure is one of a plurality of support structures embedded in the main body. The support structure can be rectangular as viewed from above the spacer. In some embodiments, the support structure is oriented orthogonally with respect to another of the plurality of support structures, as viewed from above the spacer.

At 506, a semiconductor die is coupled to a second side of the spacer opposite the first side. In some embodiments, the semiconductor die is a bottom die of a stack of memory dies, such as NAND memory. At 508, the semiconductor die is at least partially encapsulated with an encapsulant. In some embodiments, the encapsulant and the flexible main body are comprised of the same material, such as epoxy molding compound.

In some embodiments, the method 500 further includes providing a plurality of support structures including the support structure, encapsulating the plurality of support structures with a molding compound, and singulating the plurality of support structures and the molding compound to produce a plurality of spacers including the spacer. These steps can be performed to produce the spacers mounted at step 504 in a manner similar to the process depicted in FIGS. 4A-F. In some embodiments, the flexible main body of the spacer used in steps 504 and 506 are comprised of the molding compound used to encapsulate the support structures.

In some embodiments, the method 500 further includes laminating the plurality of support structures and the molding compound with a die attach film. Then singulating the plurality of support structures can include singulating the die attach film such that each of the plurality spacers includes a portion of the die attach film.

Figure 6:
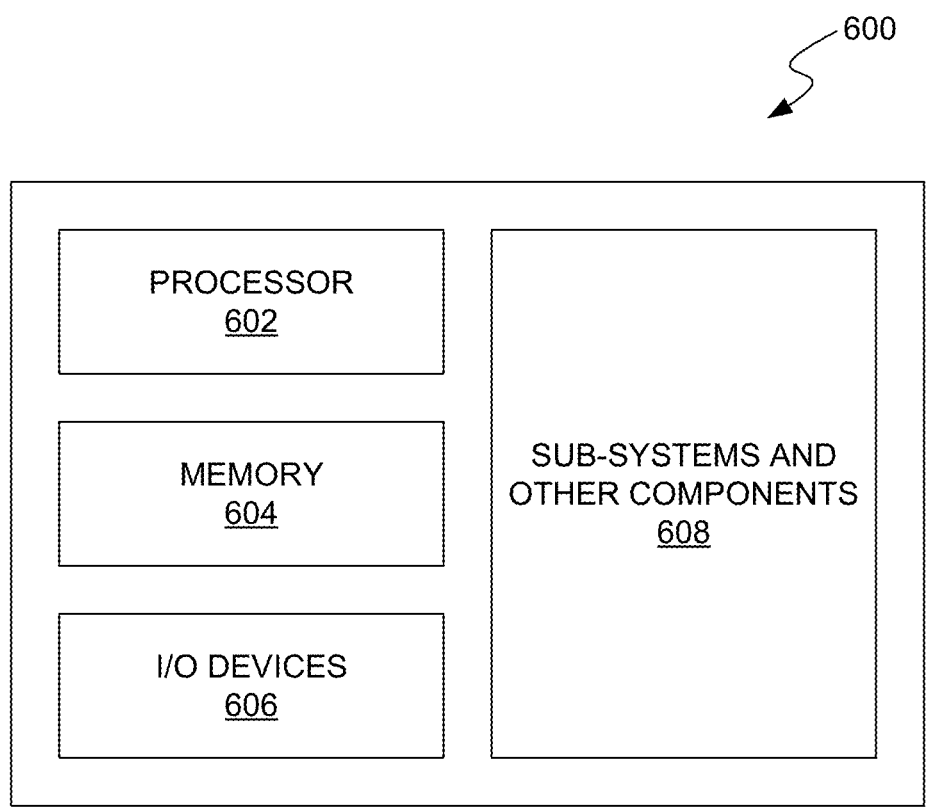
FIG. 6 is a schematic view of a system that includes a semiconductor device or package configured in accordance with embodiments of the present technology.

Any one of the semiconductor devices and/or packages having the features described above with reference to FIGS. 1A-5 can be incorporated into any of a myriad of larger and/or more complex systems, a representative example of which is system 600 shown schematically in FIG. 6. The system 600 can include a processor 602, a memory 604 (e.g., SRAM, DRAM, flash, and/or other memory devices), input/output devices 606, and/or other subsystems or components 608. The semiconductor dies and/or packages described above with reference to FIGS. 1A-5 can be included in any of the elements shown in FIG. 6. The resulting system 600 can be configured to perform any of a wide variety of suitable computing, processing, storage, sensing, imaging, and/or other functions. Accordingly, representative examples of the system 600 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 600 include lights, cameras, vehicles, etc. With regard to these and other example, the system 600 can be housed in a single unit or distributed over multiple interconnected units, e.g., through a communication network. The components of the system 600 can accordingly include local and/or remote memory storage devices and any of a wide variety of suitable computer-readable media.

From the foregoing, it will be appreciated that specific embodiments of the technology have been described herein for purposes of illustration, but that various modifications may be made without deviating from the disclosure. Accordingly, the invention is not limited except as by the appended claims. Furthermore, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

What is claimed:

1. A semiconductor device assembly, comprising:
    a substrate;
    a spacer directly coupled to the substrate, the spacer including:
        a flexible main body, and
        a support structure embedded in the flexible main body, wherein the support structure has a higher stiffness than the flexible main body;
    a semiconductor die carried by the spacer,
    wherein the support structure has a first coefficient of thermal expansion (CTE), and
        wherein the first CTE is greater than or equal to a second CTE of the semiconductor die and less than or equal to a third CTE of the substrate.

2. The semiconductor device assembly of claim 1, wherein the semiconductor die is a bottom die of a stack that comprises a plurality of semiconductor dies.

3. The semiconductor device assembly of claim 1, further comprising:
    an encapsulant at least partially encapsulating the semiconductor die, wherein the encapsulant and the flexible main body both comprise a same epoxy molding compound.

4. The semiconductor device assembly of claim 1, wherein the flexible main body comprises a polymer.

5. The semiconductor device assembly of claim 1, wherein the support structure comprises silicon, ceramic, or metal.

6. The semiconductor device assembly of claim 1, wherein the support structure is one of a plurality of support structures embedded in the flexible main body, and wherein each of the plurality of support structures is rectangular, as viewed from above the spacer.

7. The semiconductor device assembly of claim 6, wherein the support structure is oriented orthogonally with respect to another of the plurality of support structures, as viewed from above the spacer.

8. The semiconductor device assembly of claim 1, wherein the support structure has a thickness less than that of the flexible main body.

9. A method of producing a semiconductor device assembly comprising:
    providing a substrate;
    directly mounting a first side of a spacer to the substrate, the spacer including:
        a flexible main body, and
        a support structure embedded in the flexible main body, wherein the support structure has a higher stiffness than the flexible main body;
    coupling a semiconductor die to a second side of the spacer, the second side opposite the first side,
    wherein the support structure has a first coefficient of thermal expansion (CTE), and wherein the first CTE is greater than or equal to a second CTE of the semiconductor die and less than or equal to a third CTE of the substrate.

10. The method of claim 9, further comprising:
    providing a plurality of support structures including the support structure;
    encapsulating the plurality of support structures with a molding compound; and
    singulating the plurality of support structures and the molding compound to produce a plurality of spacers including the spacer,
    wherein the flexible main body of the spacer is comprised of the molding compound.

11. The method of claim 10, further comprising:
    laminating the plurality of support structures and the molding compound with a die attach film,
    wherein said singulating the plurality of support structures includes singulating the die attach film such that each of the plurality spacers includes a portion of the die attach film.

12. The method of claim 9, further comprising:
    stacking a plurality of memory dies to produce a stack of memory dies,
    wherein the semiconductor die is a bottom die of the stack of memory dies.

13. The method of claim 9, further comprising:
    at least partially encapsulating the semiconductor die with an encapsulant, wherein the encapsulant and the flexible main body are comprised of the same material.

14. The method of claim 9, wherein the support structure is one of a plurality of support structures embedded in the main body, and wherein each of the plurality of support structures is rectangular, as viewed from above the spacer.

15. The method of claim 14, wherein the support structure is oriented orthogonally with respect to another of the plurality of support structures, as viewed from above the spacer.

16. A semiconductor device assembly, comprising:
    a substrate;
    a semiconductor die stack;
    a spacer having a first side and a second side opposite the first side, wherein the first side is directly coupled to the substrate and the second side is coupled to the semiconductor die stack, the spacer including:
        a flexible polymer body, and
        a plurality of support structures embedded in the flexible polymer body, wherein each of the plurality of support structures has a higher stiffness than the flexible polymer body, wherein the support structure has a first coefficient of thermal expansion (CTE), wherein the first CTE is greater than or equal to a second CTE of the semiconductor die and less than or equal to a third CTE of the substrate.

17. The semiconductor device assembly of claim 16, wherein the spacer has a smaller area than a bottom die of the semiconductor die stack.

\* \* \* \* \*